United States Patent [19]

Kumar

[11] Patent Number: 5,521,593
[45] Date of Patent: May 28, 1996

[54] METHOD AND APPARATUS FOR MONITORING OPERATING CHARACTERISTICS OF SEMICONDUCTOR ELECTRIC POWER SWITCHING CIRCUITS

[75] Inventor: Ajith K. Kumar, Erie, Pa.

[73] Assignee: General Electric Company, Erie, Pa.

[21] Appl. No.: 801,222

[22] Filed: Dec. 3, 1991

[51] Int. Cl.$^6$ .................................................. G08C 19/12
[52] U.S. Cl. .............................. 340/870.17; 340/825.63; 340/825.06; 323/245
[58] Field of Search ..................... 340/825.17, 825.16, 340/825.06, 825.08, 825.63, 870.17, 870.21, 310 R, 310.02; 307/26, 38, 97, 117; 323/245, 246

[56] References Cited

U.S. PATENT DOCUMENTS

| | | | |
|---|---|---|---|
| 3,411,062 | 11/1968 | Kamens | 318/331 |
| 4,280,097 | 7/1981 | Carey et al. | 324/434 |
| 4,413,250 | 11/1983 | Porter et al. | 340/825.63 |
| 4,424,470 | 1/1984 | Finch | 340/825.63 |
| 4,540,890 | 9/1985 | Gangemi et al. | 340/310 R |
| 4,556,882 | 12/1985 | Brifman et al. | 340/825.06 |
| 4,571,537 | 2/1986 | Taylor | 323/245 |
| 4,916,432 | 4/1990 | Tice et al. | 340/825.06 |
| 5,003,457 | 3/1991 | Ikei et al. | 364/133 |
| 5,128,653 | 7/1992 | Yuchi | 340/870.21 |

FOREIGN PATENT DOCUMENTS

| | | |
|---|---|---|
| 0073059 | 3/1983 | European Pat. Off. . |
| 0458511 | 5/1991 | European Pat. Off. . |

*Primary Examiner*—John K. Peng
*Assistant Examiner*—Andrew Hill
*Attorney, Agent, or Firm*—Jill M. Breedlove; Marvin Snyder

[57] ABSTRACT

A monitoring system for an electrical power control system having a plurality of electrical components operable in electrically conductive and non-conductive states in response to command signals from a system controller. The controller is connected for receiving status signals indicative of the conductive and non-conductive states of selected ones of the electrical components. The monitoring system develops variable frequency electrical signals representative of preselected conditions of preselected ones of the electrical components, combines the variable frequency electrical signals with the status signals, and transmits the combined signals to the system controller. The system controller extracts the variable frequency electrical signals from the combined signals for determining the state of the preselected conditions.

9 Claims, 4 Drawing Sheets

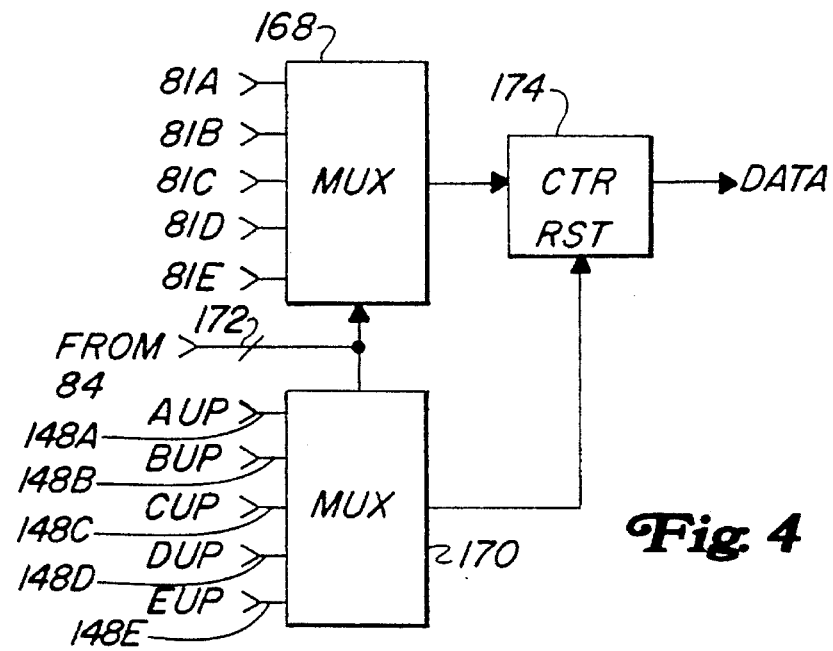
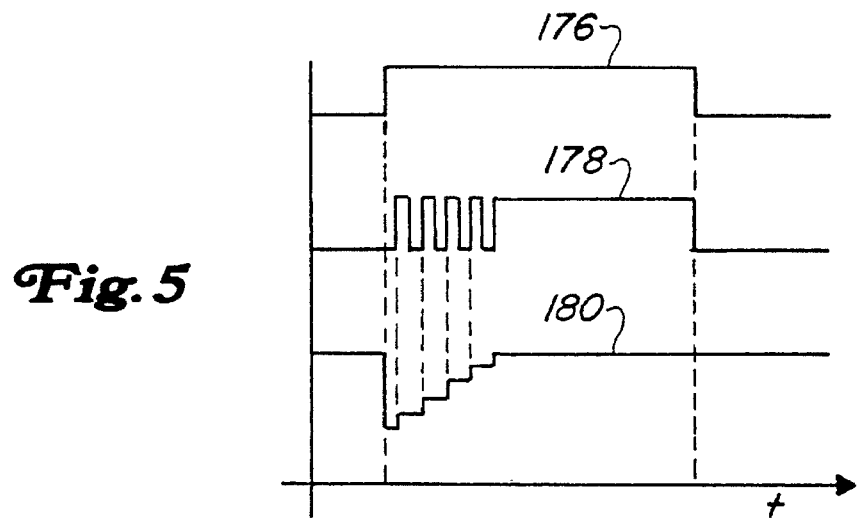
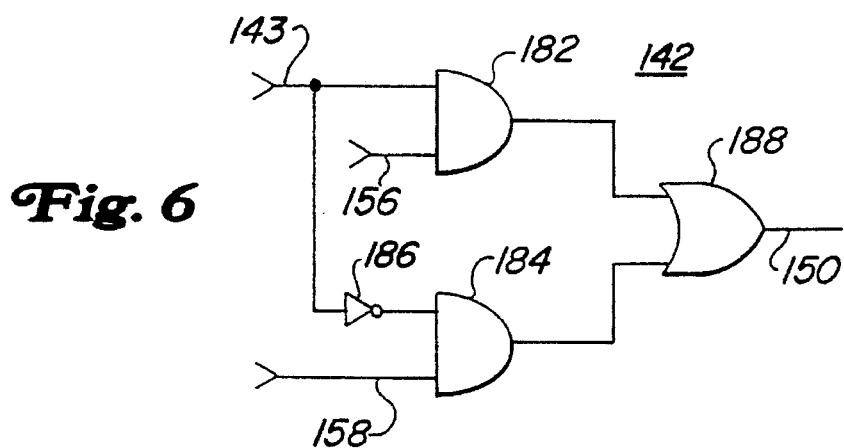

METHOD AND APPARATUS FOR MONITORING OPERATING CHARACTERISTICS OF SEMICONDUCTOR ELECTRIC POWER SWITCHING CIRCUITS

This invention relates to semiconductor electric power switching circuits and, more particularly, to a method and apparatus for monitoring of preselected operating characteristics of such switching circuits.

BACKGROUND OF THE INVENTION

Semiconductor electric power switching circuits such as pulse width modulation (PWM) converter circuits and direct current (DC) to alternating current (AC) inverter circuits typically employ thyristors as switching devices. A preferred form of such thyristors is the gate turn-off (GTO) thyristor since it requires only a relatively simple drive circuit for gating the GTO device into and out of conduction. In some applications, such as in motor drive circuits in which the GTO device may carry several hundred amperes current and be required to operate with applied voltages of several hundred volts, it is desirable to monitor the status of the GTO device, including the temperature of the device, since excessive temperature may degrade the ability of the GTO device to function properly. In some systems, the actual gating signals applied between a gate and a cathode of GTO device are monitored to confirm their application to the device in response to signals from a control unit. The control unit is typically a microprocessor based controller which establishes the conduction and non-conduction time periods of the GTO device in a manner to regulate power to the apparatus, e.g., a motor, connected to the device.

In some prior systems, the monitoring function utilizes feedback status signals via a monitoring channel to confirm status of the switching devices. The status signals may be an indicator of the gate-to-cathode drive signals applied to each GTO device. Additionally, the system may include feedback signals indicative of the temperature of the GTO device. In the illustrative relatively high voltage motor drive system, temperature monitoring has been achieved by a heat sensitive element, such as a thermistor, coupled in heat exchange relationship with the GTO device or to a heat sink on which the GTO device is mounted. In either instance, the thermistor is electrically isolated from the GTO device voltage. Data obtained from the thermistor and from other monitored characteristics is transferred to the control unit through separate channels. In a system of six GTO devices, it is common to monitor each device along with each respective gate driver thus requiring twelve separate channels for data transmission. Each such channel requires separate wiring and its own electrical circuit hardware for supplying such data. It is therefore desirable to provide a method and apparatus for monitoring such GTO devices in a manner which reduces the wiring and hardware requirements.

SUMMARY OF THE INVENTION

The present invention implements the above and other desirable features in an improved monitoring system for an electrical power control system of electrical semiconductor switching devices operable in electrically conductive and non-conductive states in response to command signals from a system controller. The system controller includes means for receiving status signals from an electric circuit coupled to the switching device, the status signals being indicative of the conductive and non-conductive states of the switching devices. Electrical signals representative of other desirable attributes of the switching devices, such as, for example, temperature, are developed and electronically combined with the status signals for transmission to the system controller. In one embodiment, electrical signals representative of temperature of each of a plurality of devices are selectively combined with status signals representative of the state of the respective one of the devices for transmission to the system controller whereby only a single channel is required to monitor a plurality of switching devices. In a preferred form, the electrical signals are pulse signals in which the number of pulses per unit time is indicative of the measured characteristic. The pulse signals are inserted into an initial portion of the status signals during an initial state change response time of the respective switching device. The system controller extracts the pulse signals from the status signals and translates the pulse signals into usable indications of temperature.

In order to minimize processing hardware in the system controller, status signals including temperature indicative electrical signals from each monitored semiconductor device are supplied to a multiplexer (MUX). The MUX selects from the array of signals the one corresponding to the semiconductor device from which status information is being obtained and passes the selected electrical signals to a counter for counting the number of pulse signals in the status signal. This number is then converted to a temperature. Accordingly, no additional signal channels are required for obtaining temperature or other variable information on semiconductors during status monitoring.

BRIEF DESCRIPTION OF THE DRAWINGS

For a better understanding of the present invention, reference may be had to the following detailed description taken in conjunction with the accompanying/drawings in which:

FIG. 4 is an illustration of one form of decoding system for data transmitted in the system of FIG. 3;

FIG. 5 has signals illustrating the operation of the system of FIG. 4; and

FIG. 6 illustrates a simplified logic circuit for implementing one of the mechanical switch functions of FIG. 3.

DETAILED DESCRIPTION OF THE INVENTION

Figure 1:
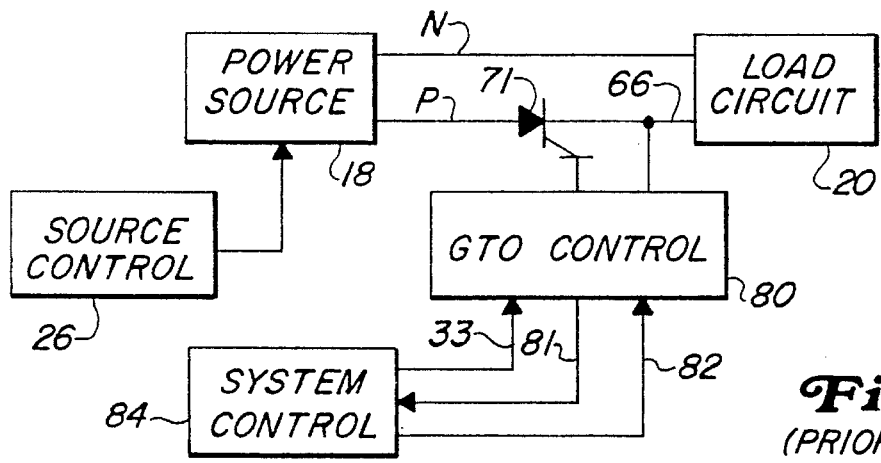
FIG. 1 is a simplified schematic representation of an electrical power control system with which the present invention may be used.

The system shown in FIG. 1 includes a source 18 of electric power, an electric load circuit 20, and means for interconnecting the source 18 and load 20. The latter means comprises a first conductor N connected directly between an output terminal of the source 18 and one end of the load 20, a second conductor P connected to another output terminal of the source 18, a third conductor 66 connected to the other of the load 20, and a high-speed, solid state controllable electric valve 71 connected between conductors P and 66. In the illustrated application of the invention, the power source 18 supplies direct current to the load circuit, and suitable control means 26 is associated therewith for the purpose of varying the magnitude of voltage between the output conductors P and N as desired. In other practical applications of the invention, the output voltage of the source is either a unipolarity voltage of relatively constant magnitude or an alternating voltage of relatively constant amplitude.

The electrical valve 71 is known generally as a gate turn-off thyristor or GTO device. It is poled to conduct load current in one direction only, i.e., from conductor P to conductor 66. Although not shown in FIG. 1, in practice, an inversely poled solid state diode and a suitable snubber circuit are usually connected in parallel circuit relationship with the valve 71. Voltage limiting means (not shown) is connected across the load circuit 20 if needed.

The GTO device 71 will conduct forward load current, i.e., current flowing into its anode and out of its cathode, when its gate electrode is triggered by a suitable turn-on or firing signal and will effectively block such current after a turn-off signal is alternatively applied to the same gate. In one application of the invention, this device is rated to conduct steady state unidirectional load current of 450 amperes when turned on and to withstand a forward voltage in excess of 1600 volts when turned off, such device being capable of successfully turning off current of 1200 amperes or more in response to a turn-off signal of suitable magnitude.

Whenever the GTO device or valve 71 is in a turned on state, it presents negligible resistance to forward load current, and such current can freely flow from output conductor P of the electric power source 18 through the conductor 66 and the load circuit 20 to conductor N. But in its turned off state, the valve resistance has such a high ohmic value as to block or interrupt any load current. To change the GTO device 71 between these two alternative states, control means 80, labeled "GTO Control", is associated therewith The control means 80 is operative in response to receipt of a discrete signal on a line 33 to change the GTO valve 71 from on to off states and at the same time to change a normally high "status" signal on an output line 81 to a low state. The control means 80 is also operative in response to receipt of another discrete signal on a separate input line 82 to change the GTO valve 71 from off to on states. The lines 33 and 82 originate in suitable system control means 84.

In the illustrated application of the invention, the system control means 84 is arranged to produce a signal on the line 82 that normally maintains the valve 71 in its turned on state (which signal is hereinafter referred to as the "enable" signal) and alternatively, if and when a certain malfunction is detected, to produce a "fault" signal on the line 33 that causes the valve 71 immediately to turn off. After the malfunction is cured, the enable signal is restored. In a different application of the invention, the GTO valve 71 is one of a plurality of interconnected valves that are repetitively turned on and off in a well known manner to form the power section of a polyphase electric power inverter 73, in which case the system control means 84 would be arranged to produce a first train of periodic, discrete signals on the line 82 and another train of periodic, discrete signals on the line 33, the latter signals being staggered with respect to the signals in the first train and the timing of each train being controlled as desired.

The turn off process of the GTO valve 71 actually has three stages. Once a GTO turn-off signal is applied to the gate of this valve, there is a brief delay (known as the "storage" time) before forward load current begins to decrease. Then, during a very short interval known as the "fall" time, current decreases rapidly to a very low magnitude. The turn-off time of valve 71, e.g., approximately fifteen microseconds, is the sum of the storage and fall times. However, the turn-off signal must not be removed before the end of a longer interval (known as the "tail" time) which is required for the valve to recover fully its ability to withstand off-state voltage without prematurely reverting to a turned-on state. During the latter interval, the valve will continue to conduct a relatively-small amount of forward load current (known as "tail" current) as its resistance increases and the voltage across it rises. At the conclusion of this process, there is no load current in the GTO valve 71, the off-state voltage applied to the main electrodes of this valve is the same as the voltage across the output conductors P, N of the power source 18, and the source 18 is effectively decoupled from the load circuit 20.

Figure 2:
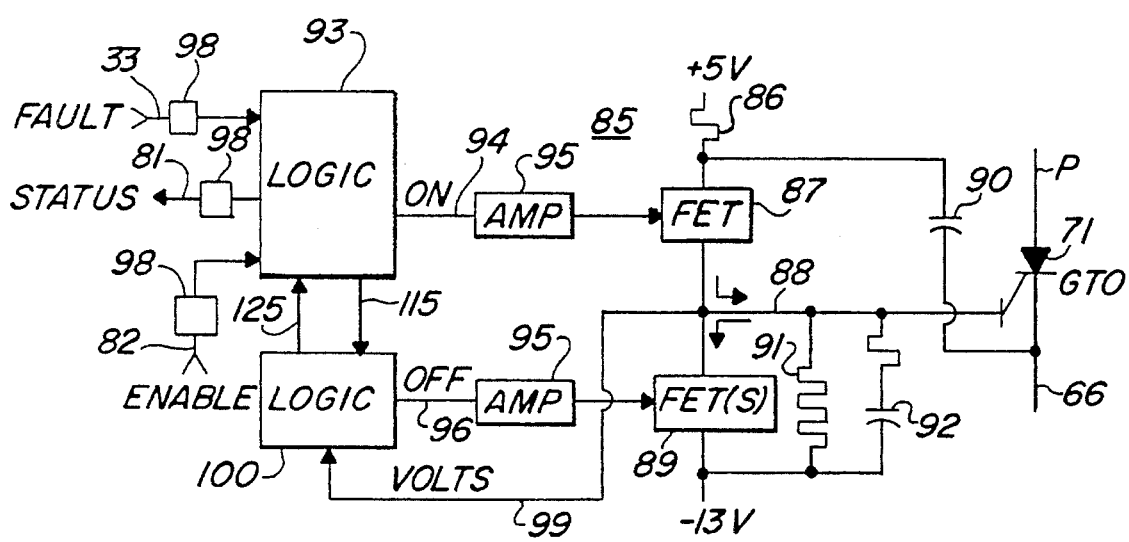
FIG. 2 is an expanded block diagram of the GTO control means of FIG. 1.

As previously described, the GTO valve 71 is changed between its on and off states by the control means 80 in response to the fault signal on line 33 and the enable signal on line 82. The presently preferred embodiment of the control means 80 is illustrated in FIG. 2 which will now be described. It comprises suitable gating means 85 for supplying the gate electrode of the valve 71 with either a positive current that effects turn-on of this device, or a relatively negative current that effects turn-off of the same device. To supply the turn-on signal, a suitable source of positive potential of approximately five volts with respect to the cathode potential of valve 71 is connected to the gate of the GTO valve 71 through a resistor 86 of low ohmic value, e.g., 0.5 ohm, a first controllable solid state switch 87, and a line 88. Preferably, the switch 87 is a conventional power field effect transistor (FET). A capacitor 90 is connected between the high side of this switch and the cathode of the GTO valve 71. When the state of the first switch 87 is changed from non-conducting to conducting, the +5 volts turn-on signal source is immediately applied to the GTO gate electrode. Preferably, this source includes electric energy storing means, e.g., a capacitor 90 of relatively high capacitance value pre-charged to a higher level of voltage, for example thirteen volts, that rapidly discharges when the switch 87 starts conducting so that an initial pulse of turn-on energy is supplied to the gate-cathode junction of GTO 71, after which the switch 87 continues conducting the required holding current from the +5 volts source.

To supply the turn-off signal for the GTO valve 71, its gate is connected to a control voltage terminal having a negative potential of approximately thirteen volts with respect to the GTO cathode through the lines 88 and a second controllable solid state switch 89 which preferably comprises a parallel array of three FETs arranged to turn on and off in unison. The second switch 89 is shunted by a bias resistor 91 and also by a circuit comprising another resistor R in series with a capacitor 92. When the second switch 89 changes to its conducting (turned-on) state, the resistance of the drain-source path in each of the three parallel FETs that form this switch is abruptly changed from a high ohmic value to a low ohmic value, and consequently the resistance between the main terminals of the switch 89 decreases to a very low value, e.g., approximately 0.007 ohm. This allows the capacitor 92 to discharge through the switch 89, thereby reversing the direction of current in the line 88. Current in the gate-cathode junction of the GTO valve will change rapidly, e.g., approximately forty amps per microsecond, from its positive holding current magnitude, e.g., +6 amperes, to a peak negative magnitude, e.g., approximately 100 amperes or more, depending on the magnitude of load current, needed to restore the valve's ability to block forward load current. As the GTO valve is turning off, the resistance of its gate-cathode junction increases and the negative gate current subsides from the aforesaid peak magnitude to a trivial magnitude. Negative current subsides at a slower rate than it rises, e.g., approximately twenty-five amps per microsecond. Once the valve turns off and the tail time expires, it will remain off until another turn-on signal is applied to its gate. The gate potential of the GTO valve is slightly above cathode potential when this device is on, and is nearly the same as the potential of the −13 volts terminal when the valve 71 is off and the second switch 89 is turned on.

The conducting states of the two switches 87 and 89 are selectively controlled by associated logic means 93 and 100 so that only one switch is conducting (turned on) at any time. An output line 94 of the first logic means 93 is coupled through an amplifier 95 to the control terminal of the first switch 87, and an output line 96 of the second logic means 100 is coupled through a duplicate amplifier 95 to the control terminal of the second switch 89. The first logic means 93 is supplied with both the fault signal on the line 33 and the enable signal on line 82, the lines 33 and 82 being respectively connected to two different inputs of this logic means through suitable optical couplers 98. A second output line of the first logic means 93 is optically coupled to the line 81 on which the status signal is provided. The second logic means 100 has two inputs: one is connected to a third output line 115 of the first logic means 93; the other is coupled to the second switch 89 via a line 99 which supplies it with a feedback value that is a measure of the voltage magnitude across the switch 89.

The logic means 93 is so constructed and arranged that the signal produced on its first output line 94 has a high or "ON" state so long as an enable signal is present on the line 82 but will change from high to low states in response to a fault signal being received on the line 33. Concurrently with the latter event, the logic means 93 changes the signal on its second output line from high to low, thereby effecting a corresponding change of status signal that the GTO control means 80 provides on line 81. An "off-pulse" timer in the logic means 93 will prevent the first output signal on the line 94, after changing from high to low states, from resuming its high state for a predetermined delay period, e.g., approximately one second. This timer also enables a high status signal to return on line 81 upon expiration of such delay period. On its third output line 115, the first logic means 93 produces an input signal for the second logic means 100, the state of this input signal being opposite to the state of the first output signal on line 94; that is, the input signal on line 115 is low whenever the first output signal is high and is high whenever the output signal is low.

From the above description, it will be apparent that the GTO control 80 is referenced to the voltage potential at the cathode of GTO 71, e.g., about 2000 volts. Accordingly, the communication channels between control 80 and system controller 84 are operated through some form of voltage isolation network since the system controller 84 is generally referenced to ground potential, i.e., zero volts. One form of such isolation is an optical link of a type well known in the art.

Each low-to-high transition of the first output on line 94 will cause the first switch 87 to conduct, thereby changing the controllable GTO valve 71 to its turned-on state. Alternatively, a low signal on the line 94 will bias the first switch 87 to its non-conducting state. Thus, a high signal on line 94 functions as a valve turn-on command. In a manner that will soon be explained, the second logic means 100 responds to the input signal on the line 115 by normally producing a signal on its output line 96 that has a high or "OFF" state so long as the input signal is high but has a low state otherwise. Each low-to-high transition of the output signal on line 96 will cause the second switch 89 to conduct, thereby changing the GTO valve 71 to its turned-off state. Alternatively, while the input signal is low, the signal on the line 96 is low so as to bias the second switch 89 to its non-conducting state, which will be true whenever the signal on the output line 94 is high if the first logic means 93 is in its ON state. Thus, a high input signal on line 115 functions as a valve turn-off command.

As will be appreciated from the above description, there is a finite time period at the beginning and end of each gating cycle of the GTO device 71 during which transition is occurring that is generally not required for status information. Applicant has discovered that these time periods may be advantageously used to convey additional information, such as device temperature, and therefore eliminate the need for additional data channels to convey such information to the system controller.

Figure 1A:
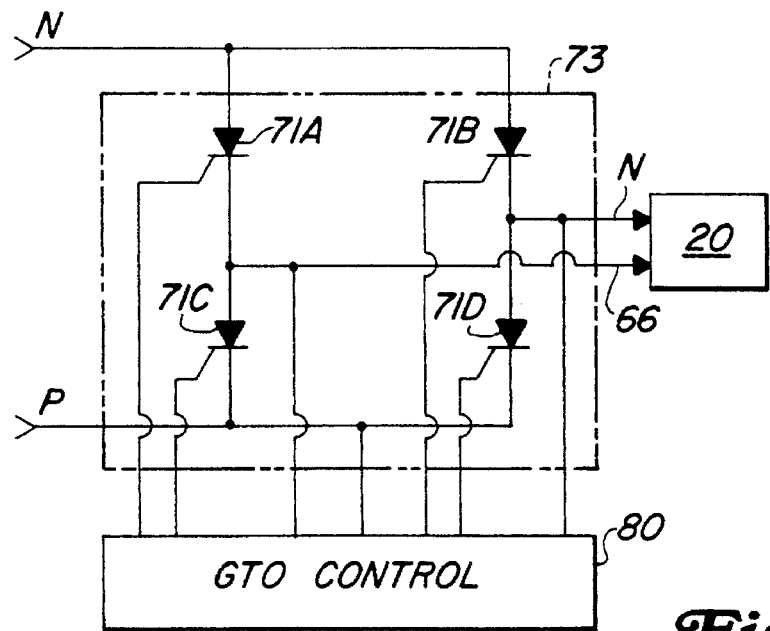
Figure 2A:
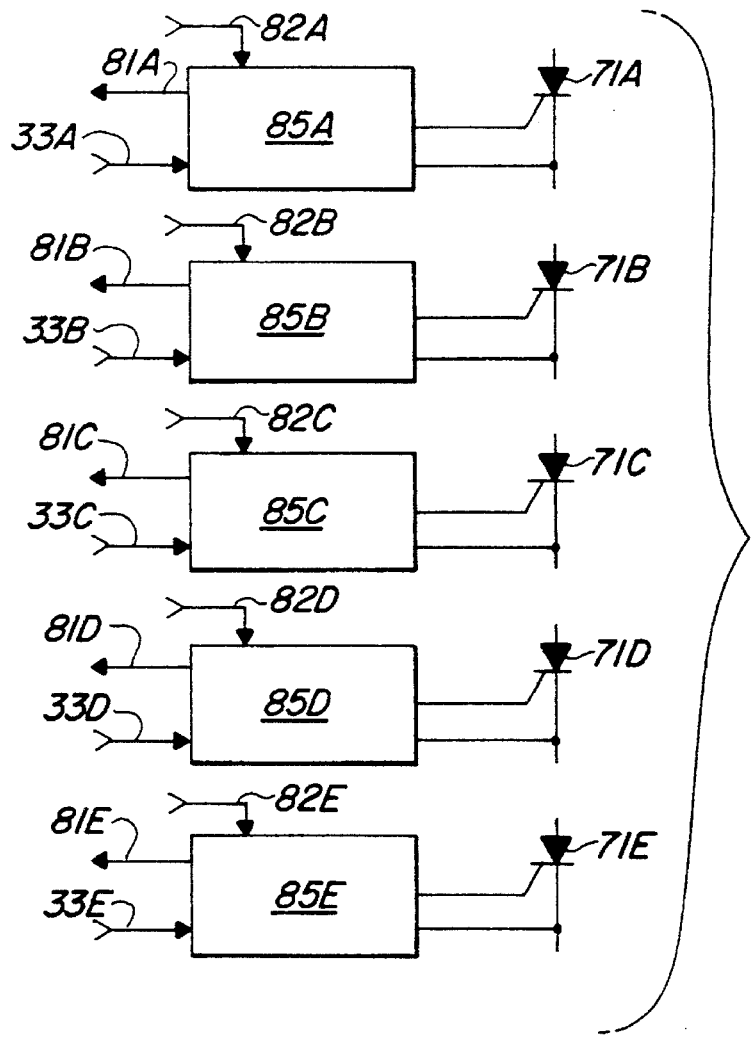
Figure 3:
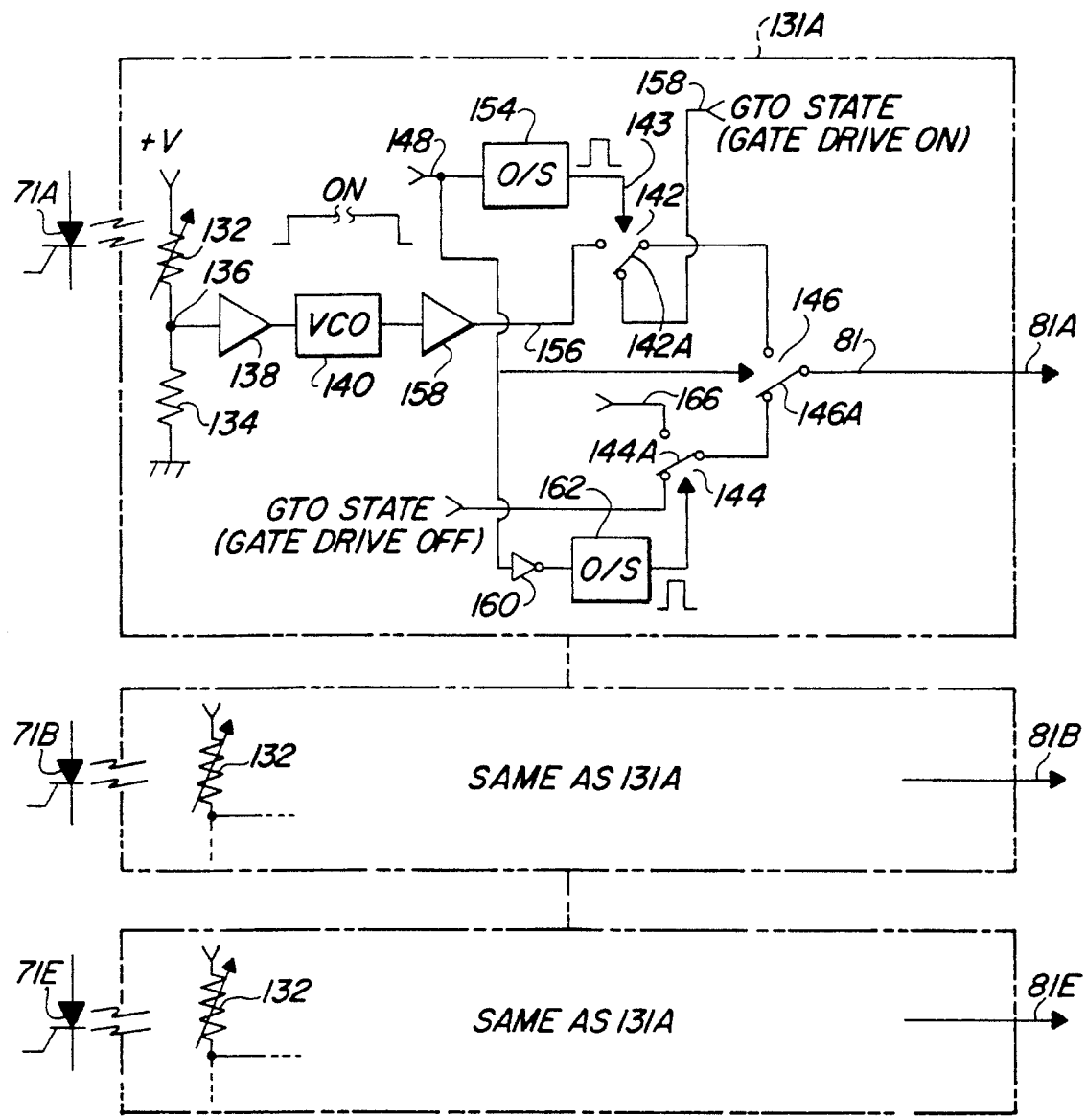
FIG. 3 is a simplified illustration of one implementation of the present invention into the system of FIG. 1.

Turning now to FIG. 3, there is illustrated one implementation of the present invention, for monitoring the temperature of one of the GTO devices 71. Obviously, the circuit of FIG. 3 would be duplicated for each GTO to be monitored thus requiring a plurality of thermistors 132 and associated components for the system of FIG. 1A. A thermistor 132 and resistor 134 are serially coupled between a voltage source V and a reference plane, typically GTO cathode potential. The thermistor 132 and resistor 134 form a voltage divider such that the voltage at the junction 136 intermediate these two components varies inversely with the resistance of thermistor 132. The junction 136 is coupled to an input terminal of a buffer circuit 138. An output terminal of amplifier 138 is coupled to a control input terminal of a voltage controlled oscillator (VCO) 140. The VCO 140 produces an output signal which varies in frequency about a preselected nominal frequency, e.g., 25 KHz, as a function of the magnitude of voltage applied to its control input terminal. Thus, any variation in the resistance value of thermistor 132 will result in a change in the voltage from amplifier 138 and effect a corresponding variation in the frequency of the signal from VCO 140 such that the frequency of the VCO output signal is representative of the resistance of thermistor 132.

The thermistor 132 can be mounted to a semiconductor device such as GTO 71 or to a heat sink (not shown) on which the GTO is mounted. In prior art systems, it has been necessary that the thermistor be provided with suitable high-potential electrical isolation from the GTO devices but in good heat exchange relationship. An advantage of the present invention is that such high-potential electrical isolation is not necessary since the gate driver 80 is referenced to cathode potential and the thermal sensor need only have five-to-ten volts of isolation. Such small value of isolation is available from the normal coating on the thermistor and therefore avoids requirements for special high-potential mounting. Such mounting can be accomplished by attaching the thermistor 132 to GTO device 71 or an associated heat sink using any of a number of commercially available thermally conductive adhesives without concern for providing electrical insulative properties.

As was described with respect to FIGS. 1 and 2, a logic circuit 93 develops a status signal on line 81 indicative of the gate-to-cathode voltage applied to a respective GTO device such as device 71. While an actual logic circuit of this form would be constructed of commercial logic elements such as AND, NAND, NOR, and OR gates, for purpose of illustration, FIG. 3 characterizes such logic circuits as controllable switches 142, 144, and 146. The ON command signal at line 148 represents a gating command to the GTO device 71 and is shown as a voltage signal having a high (logic 1) state when the GTO is to be conducting and a low (logic 0) state when the GTO is to be non-conducting. The ON command is coupled to switch 146 to control whether the signal on line 150 is coupled to the status line 81 or whether the signal on line 152 is coupled to line 81. The illustrated position of switch arm 146A corresponds to a low state of the ON command. If the ON command is present, switch arm 146A is connected to line 150.

At the same time that the ON command is applied to switch 146, it is also applied to multivibrator 154 where its leading edge transitions from a low state to a high state causing one-shot multivibrator 154 to output a signal of predetermined time duration. The output signal from one-shot 154 is coupled to switch 142 via line 143 causing switch arm 142A to transition into connection with line 156, which line carries the temperature indicative signal from VCO 140. Depending upon the voltages used in the system, a buffer/ level shifting amplifier 158 may be inserted in line 156. During the preselected time interval in which the output signal from multivibrator 154 is in a high state, the signals from VCO 140 are coupled onto line 150 and through switch 146 onto status line 81. When the signal from multivibrator 154 reverts to its normal, low state, the switch 142 reverts to its normal condition in which line 158 is coupled to line 150. The data on line 158 represents the status of gate voltage at GTO 71 as described in FIG. 2.

Additional data can also be added to the status signal at its terminal end by sensing when the ON command transitions from a high state to a low state. The ON signal is applied to an inverter 160 and the output signal from inverter 160 triggers a second one-shot multivibrator 162 identical to multivibrator 154. The one-shot signal from multivibrator 162 is coupled to switch 144 causing it to transition from a normal position as shown to having contact arm 144A connected to input line 166. Since the absence of the ON command has allowed switch 146 to revert to a condition of connecting line 152 to status line 81, the signal on line 166 is output on line 81. After a preselected time interval, one-shot 162 reverts to its normal state causing switch 144 to transition to its normal state thereby coupling the GTO 71 gate voltage signal onto line 152 and out on line 81. The signal on line 166 may comprise another variable, such as temperature at a different location adjacent GTO device 71. Other variables that may be monitored are GTO anode current at turn-off time, GTO storage time, and voltage and current during conduction.

The advantages of the system of FIG. 3 is that selected information may be combined with status signals thereby eliminating a need for separate data channels from the power circuit to the system controller and also eliminating the need for high voltage isolation of the thermal sensor, such as sensor 132. However, it is necessary to provide a means for extracting the selected information from the status signals at the controller. For the illustrative system in which the selected information comprises signals of varying frequency from VCO 140, one extraction method and apparatus is illustrated in FIG. 4. The present embodiment assumes a plurality of semiconductor GTO devices in the power control system with each GTO being monitored both for temperature and for date drive status. Each monitored GTO device will include a data channel equivalent to that shown for GTO 71 in FIG. 3. Within the system controller 84, there is provided a first multiplexer (MUX) 168 having input lines A–E, each connected to a corresponding status line from a monitored GTO gate drive circuit. A second MUX 170 has a corresponding set of input lines AUP–EUP, each connecting for receiving an ON command signal designated for a corresponding one (or more) of the GTO gate driver circuits. The system controller 84 provides commands to MUX 168 and MUX 170 via lines 172 to coordinate their operation so that the ON command corresponds in time with the monitored status line. If the ON command is applied to gate driver circuit A, then the A line in MUX 168 and Aupline at MUX 170 are selected as the active lines. The ON command is applied through MUX 170 as a RESET signal to a counter 174. A count input terminal of counter 174 is coupled to an output terminal of MUX 168 whereby the status signal from the selected GTO gate driver A is applied to the counter. Since the temperature representative signal is an alternating signal developed by a VCO corresponding to VCO 140, the counter will count the number of pulses during a preselected period of time, i.e., the frequency of the signal. The value developed by the counter 174 is representative of temperature.

Referring to FIG. 5, the A line ON command is shown at 176 with the corresponding feedback status signal at 178. The signal developed by counter 174 is represented by graph 180. The more signals received during the preselected time period, the higher the counter output. In this example, higher temperature increases the VCO frequency so that a higher count signal from counter 174 represents the higher temperature.

It should be noted that the implementation of FIG. 3 is intended only for explanation. Actual construction of such circuits would utilize conventional logic circuits rather than switches. The design of such logic circuits is well known in the art and it is not deemed necessary to discuss in detail.

The invention itself is shown in a schematic representation, including the switches 142, 144, and 146, sufficient to allow implementation in various forms. For example, switch 142 is shown in one logic form in FIG. 6. A first AND gate 182 combines the signal from one-shot 154 with the signals from VCO 140. The output signal from AND gate 182 tracks the VCO 140 output signals when the one-shot 154 output is higher but otherwise produces a low or logic 0 output. A second AND gate 184 combines the one-shot 154 signal with the status signal on line 158, but uses an inverted signal from one-shot 154 through inverter 186. The output from AND gate 184 tracks the signal on line 158 only when the output of one-shot 154 is in a low or logic 1 state. The output signals from AND gates 182 and 184 are summed in OR gate 188 and coupled onto line 150. Each of the other switches is similarly implementable.

While the principles of the invention have now been made clear in an illustrative embodiment, it will become apparent to those skilled in the art that many modifications of the structures, arrangements, and components presented in the above illustrations may be made in the practice of the invention in order to develop alternate embodiments suitable to specific operating requirements without departing from the spirit and scope of the invention as set forth in the claims which follow.

What is claimed is:

1. A monitoring system for an electrical power control system, the control system including at least one gate turn-off device operable in electrically conductive and non-conductive states in response to command signals from a system controller, the system controller including monitoring means for receiving status signals indicative of the conductive and non-conductive states of the at least one gate turn-off device, the system comprising:

means for developing variable frequency electrical signals representative of a temperature of the at least one gate turn-off device;

means for combining said variable frequency electrical signals with the status signals for transmission to the monitoring means during a relatively short time interval at least one of a leading and an ending of a time duration of the status signals; and means for extracting said variable frequency electrical signals from the status signals for determining said temperature.

2. The monitoring system of claim 1 wherein the status signals comprise a relatively long time duration pulse signal and each of said variable frequency electrical signals comprises a plurality of relatively short time duration pulse signals.

3. The monitoring system of claim 2 wherein said temperature is represented by the number of said plurality of short time duration pulse signals.

4. The monitoring system of claim 1 wherein said developing means comprises:

at least one temperature responsive element connected in heat exchange relationship with said at least one gate turn-off device, said at least one temperature responsive element being further connected in electrical circuit with a variable frequency oscillator producing said variable frequency electrical signals, the oscillation frequency of said oscillator signal varying in response to variations in characteristics of said at least one temperature responsive element as a function of temperature of said at least one gate turnoff device.

5. The monitoring system of claim 4 wherein said oscillator comprises a voltage controlled oscillator and said at least one temperature responsive element comprises a thermistor, said thermistor being connected in a voltage amplifier circuit for producing an output voltage having a predetermined relationship to the temperature of said at least one gate turn-off device, said output voltage being coupled to said voltage controlled oscillator for correspondingly varying the oscillation frequency thereof in response thereto.

6. The monitoring system of claim 3 and wherein said means for extracting said variable frequency electrical signals from said status signals comprises a counter coupled for receiving said status signals, said counter counting the number of pulses of said variable frequency electrical signals during a predetermined time period for producing a count signal representative thereof, and means coupled to said counter for converting said count signal to a signal representative of said temperature.

7. The monitoring system of claim 4 and including a plurality of temperature responsive elements each coupled in circuit with a plurality of voltage controlled oscillators, each of said plurality of temperature responsive elements being coupled in heat exchange relationship with a corresponding one of a plurality of electrical components, means for combining output signals from each of said oscillators with a corresponding status signal, the system further including means for extracting said oscillator signals from said status signals, said extracting means including a multiplexer for receiving each of said status signals, means responsive to a gating command for enabling a selected one of said electrical components and for concurrently enabling said multiplexer to process a status signal corresponding to said selected one of said components, a counter connected to said multiplexer for counting the pulses occurring during monitoring of said status signal and means for converting a count developed by said counter into a temperature indicative signal.

8. The system of claim 7 wherein said electrical components comprise gate turn-off thyristors.

9. A method for minimizing data transmission channels between a power converter and a system controller, at least one data transmission channel existing between the converter and controller for transmitting a status signal indicative of a preselected status of at least one electrical component in the converter, the method comprising the steps of:

monitoring a preselected condition of the at least one electrical component in the power converter and developing a signal representative thereof;

converting the monitored condition signal to a variable frequency signal in which the instantaneous frequency of the variable frequency signal is representative of the monitored condition;

inserting the frequency signal into the status signal during a preselected time slot at one of a beginning and ending of the status signal; and decoding the frequency signal in the system controller to determine a value of the preselected condition, the step of decoding including processing of the status signal in a manner to extract the frequency signal therefrom prior to determining a value of the preselected condition.

* * * * *